United States Patent [19]

Crowell et al.

[11] Patent Number: 4,760,334

[45] Date of Patent: Jul. 26, 1988

[54] DIGITAL PANEL METER

[75] Inventors: Thomas Crowell, Dedham; Brian Paulsen, Monument Beach, both of Mass.

[73] Assignee: R. T. Engineering Service, Inc., Mansfield, Mass.

[21] Appl. No.: 835,653

[22] Filed: Mar. 3, 1986

[51] Int. Cl.⁴ .............................................. G01R 1/04
[52] U.S. Cl. ................................................... 324/156
[58] Field of Search ................ 324/156, 110; 439/707, 439/718; 361/369, 364

[56] References Cited

U.S. PATENT DOCUMENTS 3,628,096 12/1971 Drew, Jr. et al. .................. 324/156
3,725,852 4/1973 Blanchet .............................. 439/718
3,793,563 2/1974 Brefka ................................. 324/156
4,157,501 6/1979 Cain, Jr. et al. ..................... 324/156

Primary Examiner—Reinhard J. Eisenzopf
Assistant Examiner—Anthony L. Miele
Attorney, Agent, or Firm—Wolf, Greenfield & Sacks

[57] ABSTRACT

A digital panel meter that is mounted in a panel and that is comprised of a housing for containing a circuit assembly having a digital display at the front of the housing. A bezel is adapted to cover the front of the housing and has a transparent window for the viewing of the digital display. The bezel includes a pair of elongated bezel locking arms that are spacedly disposed and extend towards the rear of the housing where they interlock with the housing. The housing is also provided with locking tabs for securing the housing to the panel.

18 Claims, 4 Drawing Sheets

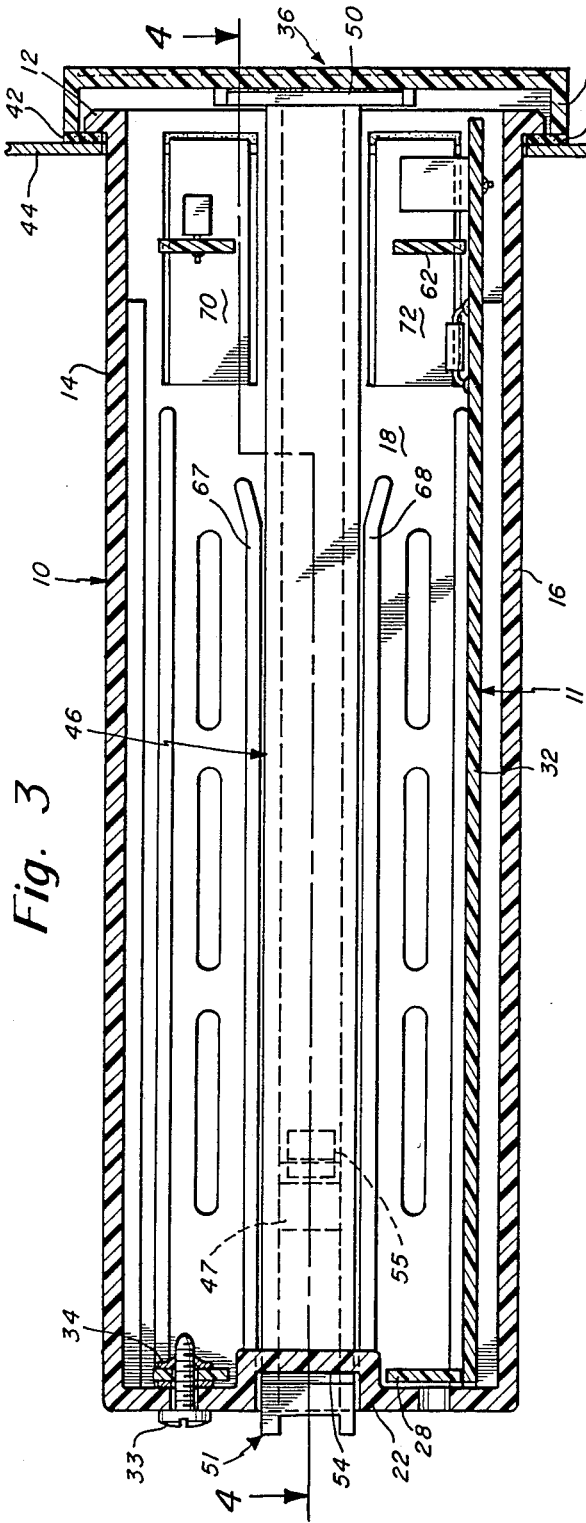
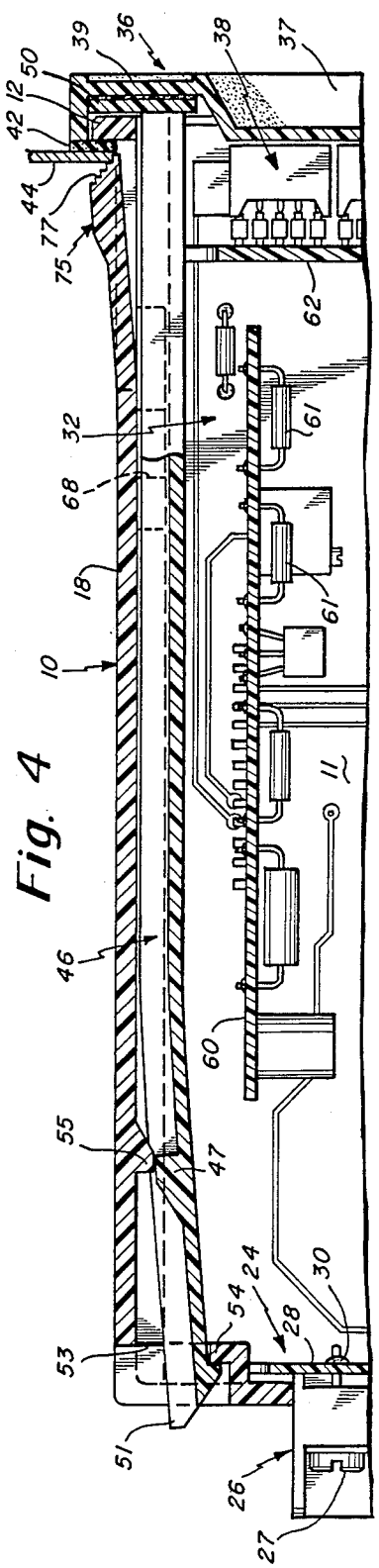
Fig. 3
Fig. 4

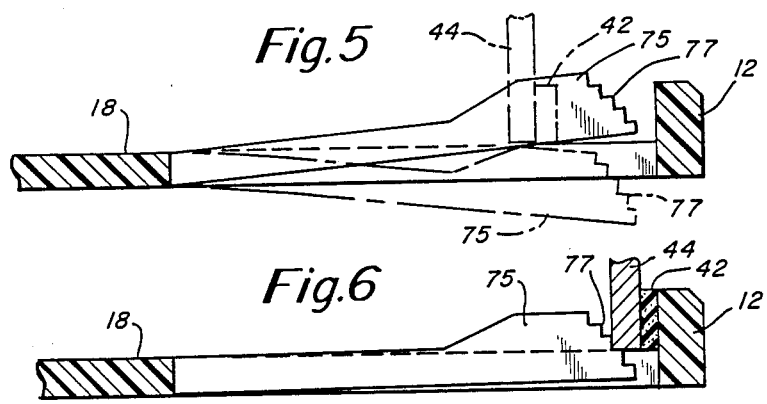
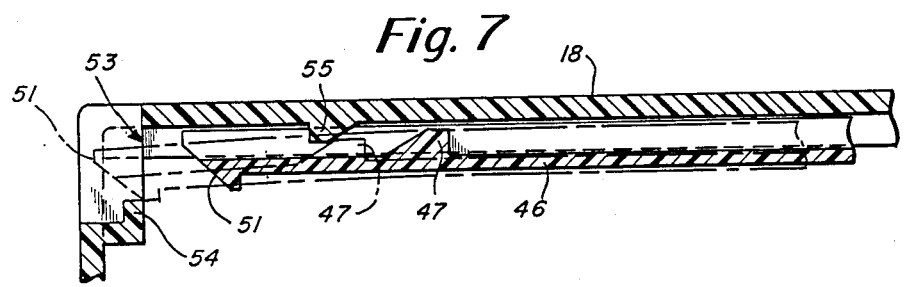
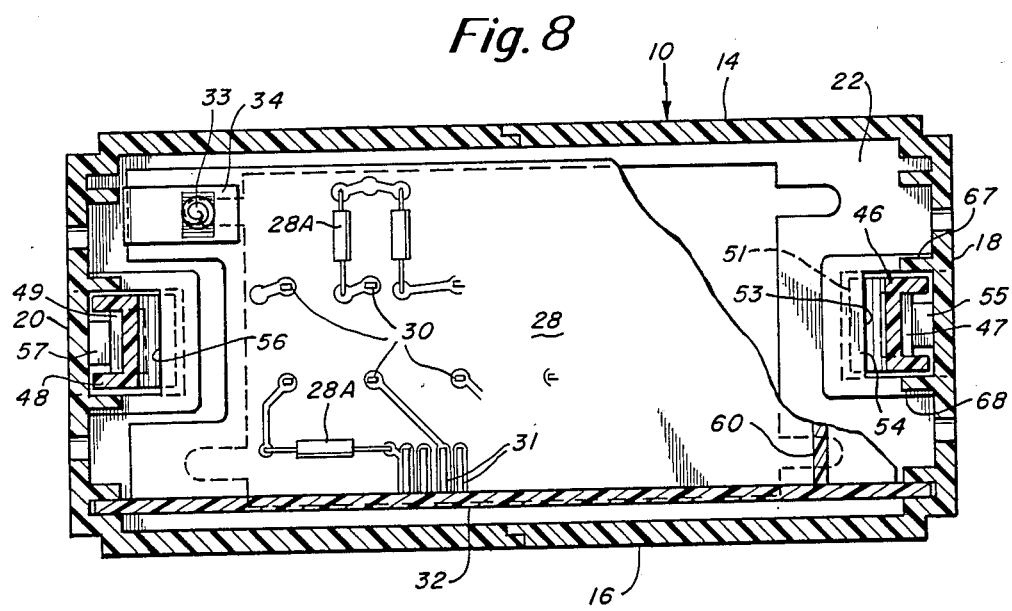

4,760,334

DIGITAL PANEL METER

BACKGROUND OF THE INVENTION

The present relates in general to meters and is concerned, more particularly, with a digital panel meter that may be used as a replacement meter for a standard analog panel meter. The meter of this invention may be used for replacement of the standard $3\frac{1}{2}''\times 4\frac{1}{2}''$ analog meter that is presently in use in some applications.

A U.S. Pat. No. 4,157,501 also assigned to the same assignee as herein, describes a digital panel meter that is adapted to a process either AC or DC input signals.

It is an object of the present invention to provide still further improvements in the digital panel meter as will be described in further detail hereinafter.

On object of the present invention is to provide an improved digital panel meter and one that has universal range adjustment and that accepts both DC and AC input signals.

Another object of the present invention is to provide a digital panel meter that is very easy to install and calibrate even by a non-technical person.

A further object of the present invention is to provide a meter having improved accuracy.

Still a further object of the present invention is to provide a digital panel meter that is quite compact and that provides a simple means for change from one range of operation to another.

Still another object of the present invention is to provide a digital panel meter that has a range scale adjustment and that has the capability of use of the decimal point.

Another object of the present invention is to provide a digital panel meter that may be used in many different process applications including applications for reading in revolutions per minute, feet per minute, meters per minute, strokes per minute, bags per minute, pounds, gallons, amperes (DC or AC), volts (DC or AC), and percent load.

A further object of the present invention is to provide an improved meter housing construction and a particular one employing improved front bezel cover arrangement that may be readily interlocked with the meter housing and which is readily removable therefrom.

Still a further object of the present invention is to provide an improved digital panel meter housing construction which is automatically adapted for receipt by control panels or the like of different panel thickness.

SUMMARY OF THE INVENTION

To accomplish the foregoing and other objects and features and advantages of the invention there is provided a digital panel meter that is adapted to be mounted in a panel such as a control panel in which there may be mounted a plurality of similar meters or other electrical products. The digital panel meter of the invention comprises a housing having an open front and a means for securing the housing to the panel. A circuit assembly is adapted to be disposed inside of the housing and includes at least one circuit board, a terminal block at the rear of the circuit assembly and a digital display at the front of the circuit assembly. This digital display is also disposed adjacent to the open front of the housing. A bezel is adapted to cover the open front of the housing and includes a bezel cover means having a transparent window for viewing of the digital display. A pair of elongated bezel locking arms are spacially disposed in parallel and extend from the bezel cover means toward the rear of the housing. The housing has means defining spacedly disposed locking recesses. These locking recesses are preferably at the rear of the housing. The locking recesses are spaced relative to each other by a distance that is about the same as the spacing between the locking arms. The locking arms each have an end locking member that is adapted to interlock with the respective locking recess in the housing to secure the bezel cover means against the housing at the open front thereof. The locking member at the end of each locking arm includes a hook with each of the hooks being disposed in facing relationship. The locking recesses are at the rear of the housing, one on either side of the terminal block. The terminal block is supported in an upright position and in this connection the rear of the housing has an opening for receiving the terminal block so that the terminal block extends outwardly from the housing in an accessible position. The terminal block preferably has a plurality of terminal studs to which wires are attached including a jumper wire for determining a range of the meter. The terminal block may be supported from a base circuit board which in turn supports a rear vertical circuit board affixed to the base circuit board. With regard to the locking arms, the housing includes sidewalls each having longitudinally extending guide channels for each of these locking arms. The locking arm and guide channel also both have lamp means associated therewith. The locking arm has an arm ramp that complimentarily engages with a recess ramp to force the hook end of the locking arm into positive engagement with the housing locking recess. The locking arm preferably has a U-channel cross section with the arm ramp disposed in the U-channel spaced forwardly of the hook end of the locking arm. The circuit assembly preferably comprises a base circuit board received in slots in sidewalls of the housing, a front circuit board supported upright from the base circuit board and in turn supporting the digital display, and the aforementioned rear circuit board that is also supported upright from the base circuit board and which in turn supports the terminal block. Both the front and rear circuit boards are preferably supported from the base circuit board by means of circuit contacts. In this way, separate supports are not needed as the circuit contacts themselves both provide circuit continuity from the baseboard to the other boards as well as support. The housing is secured to the panel by a very simple arrangement that comprises at least one locking tab on either side of the housing and disposed adjacent to the open front of the housing. In the preferred embodiment actually a pair of spaced locking tabs are provided on each sidewall of the housing. The locking tab is directed slightly outwardly of the housing sidewall so as to be deflected by the panel when the housing is inserted in a panel opening. The locking tab has a stepped end so as to accommodate panels of varying thickness.

BRIEF DESCRIPTION OF THE DRAWINGS

Numerous other objects features and advantages of the invention should now become apparent upon a reading of the following detailed description taken in conjunction with the accompanying drawings, in which:

FIG. 3 is a cross-sectional view of the digital panel meter as taken along line 3—3 of FIG. 2;

FIG. 4 is a cross-sectional view taken along line 4—4 of FIG. 3;

FIG. 5 is a fragmentary enlarged view showing the meter to panel locking at an initial stage;

FIG. 6 is a fragmentary enlarged view showing the meter to panel locking at a finally interlocked stage.;

FIG. 7 is a fragmentary enlarged view illustrating the manner in which the vessel interlocks with the housing;

FIG. 8 is a cross-sectional view taken long line 8—8 of FIG. 2; and,

DETAILED DESCRIPTION

Figure 9:
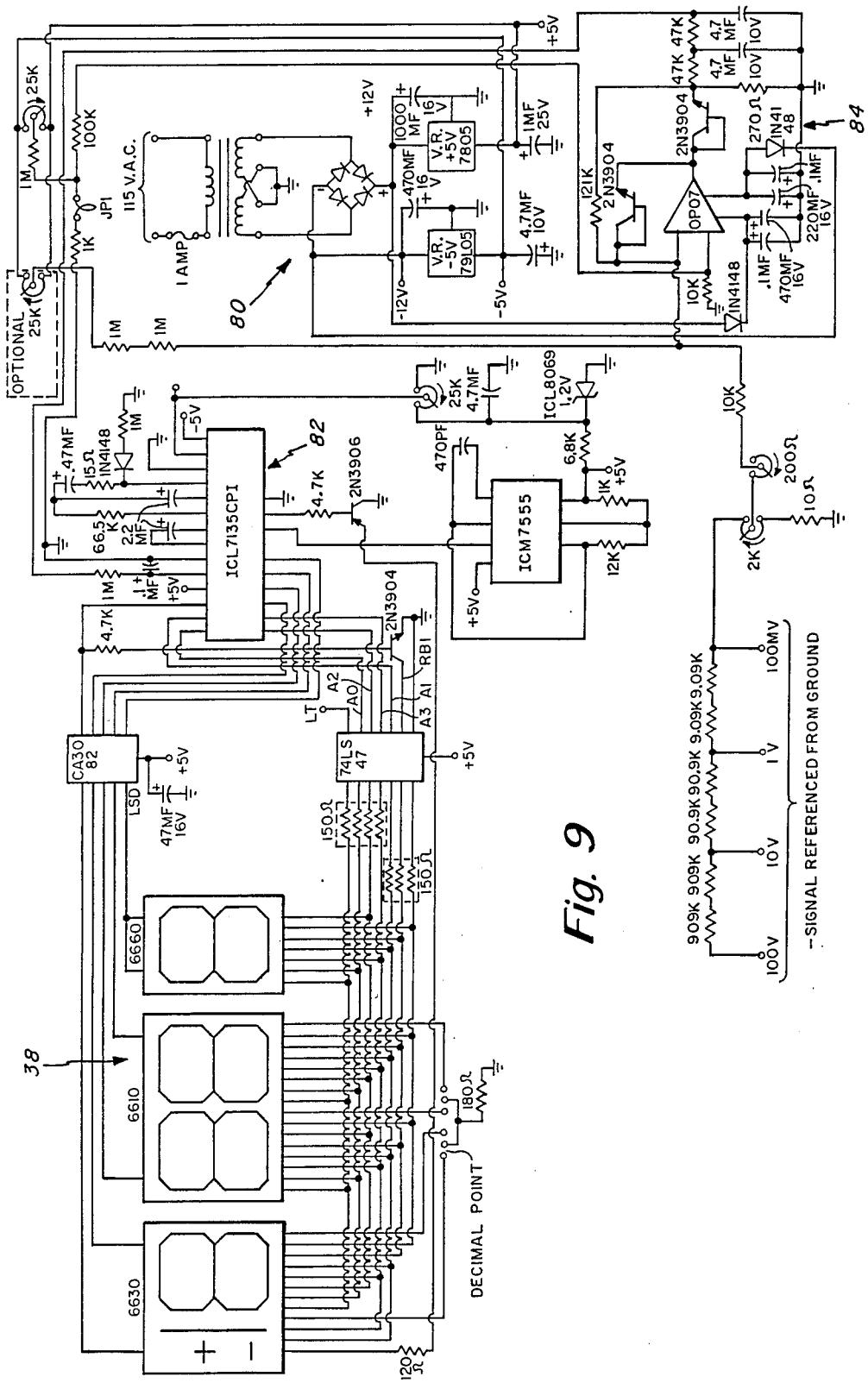
FIG. 9 is a circuit diagram illustrating a typical circuit for the meter.

FIGS. 1-8 illustrate details of the digital panel meter and in particular the mechanical details relative to the meter. FIG. 9 illustrates a circuit diagram of the digital meter itself.

The meter of the present invention has many applications. The device is a digital indicator which reads almost any industrial process parameter. The meter is capable of monitoring and displaying in electrical units and can also be calibrated in engineering units utilizing, for example, signals from an AC or DC tachometer, or directly from the armature voltage of a DC motor.

In the preferred embodiment of the invention there are 4 input ranges which can accept DC signals from 50 mV DC to 500 VDC and also AC signals from 100 mV AC to 480 VAC.

The meter is constructed of a rugged high impact plastic (UL94V-0) case along with a bezel which may be constructed of Lexan and which is disposed over the display for providing durability particularly in industrial environments. Solid state circuitry is employed such as the circuit of FIG. 9. This insures accuracy and reliability. In addition, the UL94V-0 high impact plastic case with "RFT Coating" provides an electrostatic shield that makes the indicators virtually immune to electrical noise.

By way of example, one application for the meter of the invention is in a punch press application in which the ruggedness of the meter is important. The constant machine vibration that occurs would damage an analog meter but will not harm the digital panel meter of this invention which essentially has no moving mechanical parts.

Another application for the meter of this invention is the monitoring of AC motor amps. Again, the inrush current to the motor might easily damage an analog meter. However, the same inrush current has no harmful effect on the digital panel meter of this invention.

Figure 1:
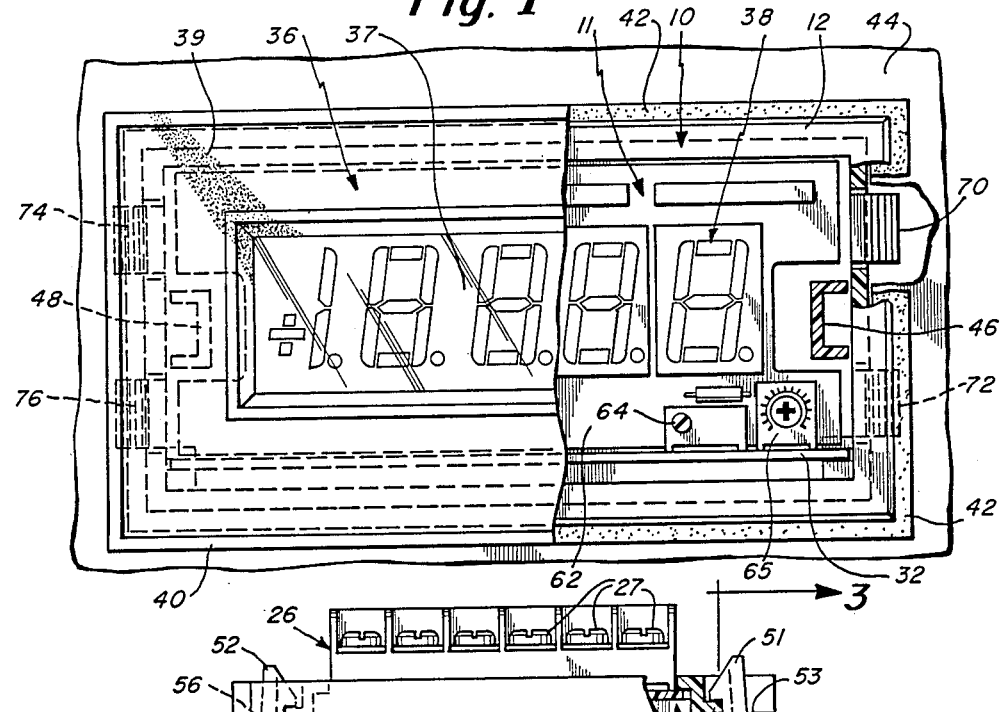
FIG. 1 is a front view of the digital panel meter partially cut away to show internal details.
Figure 2:
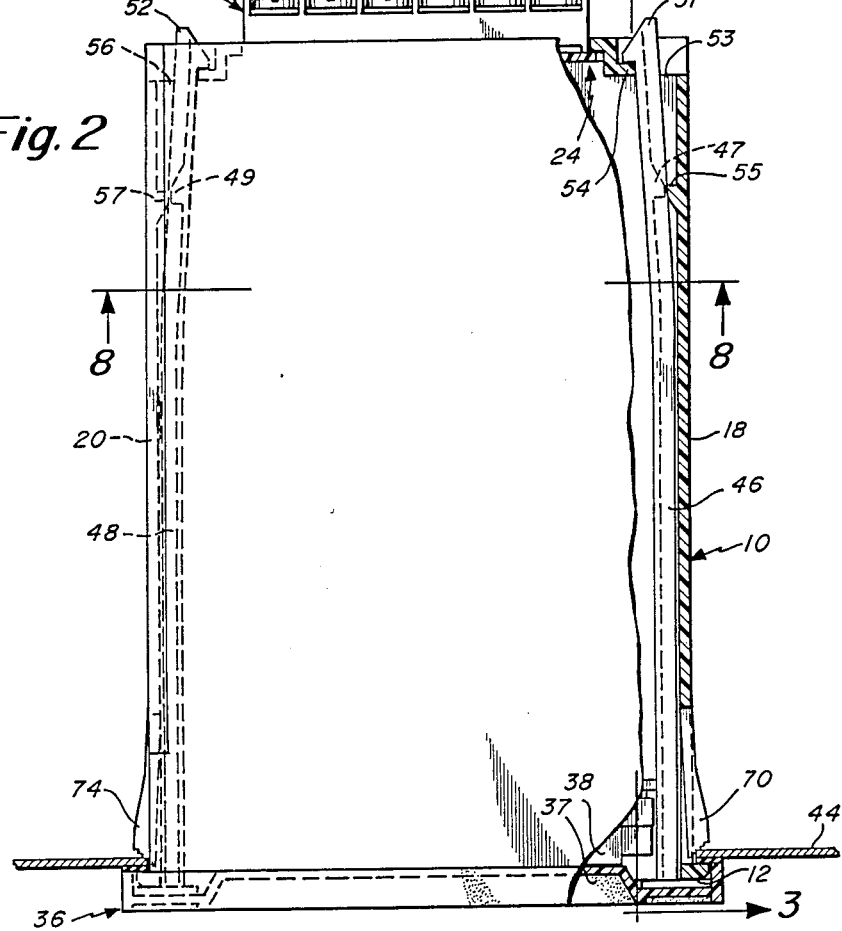
FIG. 2 is a plan view of the digital panel meter of FIG. 1 also partially cut away to show further details.

Referring now in particular FIGS. 1-8, the meter comprises a housing 10 which is preferably constructed of UL94V-0 high impact plastic and which has an open front defined by a peripheral housing flange 8. The housing 10 is of generally rectangular construction having a top wall 14 and a bottom wall 16 such as shown in FIG. 3 along with side walls 18 & 20 such as illustrated in FIG. 2. The housing 10 also has a rear wall 22 defining a relatively large rectangular opening 24. The opening 24 as illustrated in FIG. 2 is adapted to receive the terminal block 26. The terminal block 26 may be a conventional design constructed of an insulating hard plastic material and supporting a plurality of terminal screws 27 such as illustrated in FIG. 2.

As illustrated in FIGS. 2 and 4, the terminal block 26 is secured to a rearwardly disposed printed circuit board 28. FIG. 4 shows one of the electrical contact points at 30 which couples to the terminal block and which provides the dual function of securing the terminal block to the board 28 at the same time providing electrical continuity to components mounted on the terminal board 28. As illustrated in FIG. 3, the rearwardly disposed printed circuit board 28 is supported in an upright fashion from the horizontally disposed base circuit board 32. The rear circuit board 28 is in turn secured to the housing by means of a pair of securing screws 33 which pass through the rear wall 22 of the housing and which are threadedly engaged in a metal clip 34 as illustrated in FIG. 3. With regard to the retention of the circuit assembly in the housing it is noted that the entire circuit assembly including the printed circuit boards 28 and 32 are disposed into the housing from the front thereof through the open front defined by the peripheral housing flange 12. The screws 33 are then fastened to the printed circuit board 28 to retain the entire circuit board assembly in place within the housing.

With reference to FIGS. 1-4 in particular, there is also illustrated, beside the housing 10 and the circuit assembly 11, a bezel that covers the front of the housing and the circuit assembly. The bezel 36 is preferably constructed of a hard plastic material such as Lexan and has a centrally disposed window 37 that is a clear Lexan portion. In this regard note FIG. 1 and the clear portion 37 with the digital characters being displayed therebehind. These characters are on the digital display 38. The bezel 36 also has a frosted peripheral portion 39. As illustrated in FIG. 3, the bezel also has a peripheral lip 40. Also illustrated in FIG. 3 is the gasket 42 which may be a neoprene gasket adapted to be disposed between the lip 40 and flange 12 on one side and the panel 44 on the other side. FIG. 1 also shows the neoprene gasket 42 as does FIG. 2. The panel 44 is dimensioned such as illustrated in FIG. 2 so as to readily receive the housing of the meter as will be discussed in further detail hereinafter. When in the interlock position as illustrated in FIGS. 2 and 3, it is noted that the lip 40 and flange 12 are in the same vertical plane urging against the gasket 42 and compressing the gasket against the supporting panel 44.

In accordance with the invention the bezel 36 is attached to the housing and secured against the panel 44 by means of a pair of elongated bezel locking arms 46 and 48 and are disposed in parallel and extend from the bezel toward the rear of the housing. FIG. 2 shows the pair of locking arms 46 and 48 one in solid outline and the other in dashed outline. FIG. 4 shows specific detail of the locking arm 46. FIG. 1 shows the U-shaped cross-section of the locking arm 48. This U-shaped cross-section provides a channel in the locking arm such as illustrated in FIG. 4 in which there is provided a ramp member 47. The locking arm 48 has a similar ramp member 49.

Each of the locking arms 46 and 48 secures to the bezel in the manner illustrated in FIG. 4. In this regard an epoxy cement or ultrasonic welding is used as illustrated at 50 to hold the locking arm to the bezel. Each of the locking arms also has a hooked end such as illustrated in detail in FIG. 4. There is a hooked end 51 associated with the arm 46 and similarly a hooked end 52 associated with the arm 48. Both of these hooked ends are adapted to engage in recesses in the housing at the rear thereof. In this regard note the recess 53 on one side of the terminal block in FIG. 2 and also the oppositely disposed recess 54 on the other side of the terminal block. FIG. 4 illustrates the recess of 53 which is defined in part by a ridge 54 that is the ridge against which the hooked end 51 of the arm 46 interlocks. Also illustrated in FIG. 4 is a second ramp member 55 which is integral with the housing wall 18. The ramp members 47 and 55 illustrated in FIG. 4 compliment each other and in the position illustrated in FIG. 4 they have passed adjacent to each other and both are engaged on the top of each respective ramp thus positively engaging the hooked end of the arm against the ridge 54 of the recess 53. The same type of interlocking also occurs on the opposite side of the housing by virtue of a ramp member 57 as illustrated in FIG. 2.

With regard to the circuit board assembly 11, this is comprised of a base circuit board 32 referred to previously along with the rear circuit board 28 also referred to previously. Each of these circuit boards has a plurality of components mounted thereon. Many of these components are illustrated in the circuit diagram of FIG. 9. In this regard FIG. 8 which is a cross-sectional view of FIG. 2 illustrates the rear circuit board 28 with components being mounted thereto such as the components 28A. FIG. 8 also illustrates the contacts at 30 that support the circuit board 28 and also provide electrical continuity between the circuit boards 28 and 32.

In the particular embodiment described herein, there is also preferably provided a vertically disposed circuit board 60 which is illustrated in FIG. 4 and which also has components mounted thereon such as the components 61 illustrated in FIG. 4. This circuit board is also supported from the baseboard 32 by means of electrical contact support for providing both physical support and electrical continuity between the circuit boards.

Finally, there is at the front of the circuit board assembly 62 which is likewise supported by means of electrical contacts from the base circuit board 32. FIG. 4 illustrates a fragment of the front circuit board 62 which supports on the front side thereof the digital display 38. It is noted that the digital display segments are supported just behind the window 37 on the front bezel.

FIG. 1 illustrates the display 38 secured to the circuit board 62 and also illustrates the base circuit board 32. At the very front of the base circuit board 32 there is also mounted a course scale adjusting potentiometer 64 and fine scale adjusting potentiometer 65. With regard to the base circuit board 32 it is noted that the housing has a slot at the sidewalls thereof for supporting the circuit board 32 as illustrated in FIG. 1.

As indicated previously, the circuit assembly 11 is inserted into the housing 10 from the front thereof. The primary engagement between the assembly and the housing is by virtue of the base circuit board 32 sliding in longitudinally disposed side slots such as illustrated in FIG. 8 of the present application. Similarly, the bezel 36 is engaged into the housing through the front thereof. The elongated arm 46 and 48 are disposed to the opposite sides of the circuit board assembly. FIG. 4 shows one of the arms extending by the side of the circuit board assembly and into contact with the rear of the housing of the hook end 51 of arm 46. In order to provide proper guiding of the arms 46 and 48 there are guide channels provided on each of the sides of the housing in the respective sidewalls. FIG. 3 illustrates one side in which a guide channel is defined by elongated ribs 67 and 68. FIG. 3 shows the locking arm 46 extending between these ribs. It is the ramp member 55 illustrated in dotted outline in FIG. 3 that is disposed within the channel defined by these ribs.

Reference is now made to FIG. 7 which is a fragmentary view illustrating the manner in which the locking arms are guided in the channel defined by the ribs 67 and 68. In FIG. 7 the locking arm is shown in a solid outline in a position approaching the end of the housing but in which the ramp members 47 and 55 have not yet interengaged. FIG. 7 also illustrates in dotted outline the ramp member 47 just engaging with the ramp member 55 with the hooked end 51 of the locking arm also shown in dotted outline and just engaging with the ridge 52 of the recess 53. As the locking arm moves further to the position illustrated in FIG. 4, the ramp member 47 rides up the ramp member 55 further to tops thereof forcing the hooked end 51 into engagement behind the ridge 54. Thus, the bezel interlocking is carried out in a manner in which, just as the hooked end is about to engage with the ridge 54 the ramps operate so as to interlock in the position illustrated clearly in FIG. 4.

Another feature in accordance with the invention is the means for securing the housing to the panel 44. This comprises at least one locking tab on each side of the housing disposed adjacent to the open front of the housing. In this regard in FIG. 1 there are shown two pairs of locking tabs each pair integral with a sidewall of the housing. In FIG. 1 these are illustrated as locking tabs 70 and 72 on one side and locking tabs 74 and 76 on the other side. All of these locking tabs are of identical construction such as the tabs 70 and 72 illustrated in FIG. 3. These locking tabs are essentially integral with their respective sidewalls and each have enlarged ends such as illustrated at 75 in FIG. 4. FIG. 4 also illustrates the stepped surface at 77 which provides the engagement with the panel 44.

Now, with regard to the manner in which the locking tabs operate, reference is made to FIGS. 5 and 6 which are fragmentary views showing the sequence of operation. In FIG. 5 the locking tab at 75 is shown in solid line in its normal position. FIG. 5 also shows the locking tab being deflected as the bezel is pushed inwardly and as the tab is pushed past the supporting panel 44 at the opening thereof. FIG. 6 shows the bezel in its most inward position with the gasket being compressed between the housing flange 12 and the panel 44. FIG. 6 also illustrates the step surface 77 with one of the steps engaging with the panel 44. The stepped surface 77 is important in enabling the locking tab to operate with panels of various thickness.

Reference is now made to FIG. 9 which is a circuit diagram of the meter circuit that is embodied on the difference printed circuit boards referred to here and before. The circuit of FIG. 9 is considered for the most part to be of conventional design including the digital display 38 and a power supply section 80. As a matter of fact the circuit illustrated in FIG. 9 is similar to the circuit illustrated in FIG. 4 of the aforementioned U.S. Pat. No. 4,157,501. Accordingly, the details of the circuit of FIG. 9 are not described in detail herein. In addition to the power supply section 80 and the display 38 the circuit also includes a display driver chip 82 which is of conventional design and an analog input section 84.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. A digital panel meter adapted to be mounted in a panel and comprising;
a housing having an open front, side walls and means for securing the housing to said panel,
a circuit assembly adapted to be disposed inside the housing and including a digital display at the front of the circuit assembly,
a bezel adapted to cover the open front of the housing and including a cover means having means defining a window for viewing of said digital display and a pair of elongated bezel locking arms spacedly disposed in parallel and extending from said cover means toward the rear of the housing,
said housing having means defining spacedly disposed locking recesses,
said locking arms each having an end locking member adapted to interlock with the respective locking recess in the housing to secure the bezel cover means against the housing at the open front thereof,
at least one of said locking arm and housing sidewalls having a ramp means for maintaining an interlock between said locking arm and locking recess.

2. A digital panel meter as set forth in claim 1 wherein said locking member at the end of each locking arm includes a hook with each of the hooks being disposed in facing relationship.

3. A digital panel meter as set forth in claim 2 wherein the locking recesses are at the rear of the housing, one on either side of the terminal means.

4. A digital panel meter as set forth in claim 3 wherein said terminal means includes a terminal block and means supporting the terminal block in an upright position, the rear of the housing having an opening for receiving the terminal block so that the terminal block extends outwardly from the housing in an accessible position.

5. A digital panel meter as set forth in claim 4 including means at the rear of the housing for securing the circuit assembly to the housing.

6. A digital panel meter as set forth in claim 5 wherein said means for supporting the terminal block includes a base circuit board and a rear vertical circuit board affixed to the base circuit board, and said means for securing the circuit assembly includes screws for securing the rear vertical circuit board to the housing.

7. A digital panel meter as set forth in claim 3 wherein said housing includes side walls each having longitudinally extending guide channels for each locking arm.

8. A digital panel meter adapted to be mounted in a panel and comprising;
a housing having an open front, side walls and means for securing the housing to said panel,
a circuit assembly adapted to be disposed inside the housing and including at least one circuit board, terminal means at the rear of the circuit assembly and a digital display at the front of the circuit assembly and at the open front of the housing,
a bezel adapted to cover the open front of the housing and including a cover means having means defining a transparent window for viewing of said digital display and a pair of elongated bezel locking arms spacedly disposed in parallel and extending from said cover means toward the rear of the housing,
said housing having means defining spacedly disposed locking recesses,
said locking recesses being spaced relative to each other by a distance about the same as the distance between the locking arms,
said locking arms each having an end locking member adapted to interlock with the respective locking recess in the housing to secure the bezel cover means against the housing at the open front thereof,
said circuit assembly comprising a base circuit board received in slots in side walls of the housing, a front circuit board supported upright from the base circuit board and in turn supporting the digital display, and a rear circuit board supported upright from the base circuit board and in turn supporting the terminal means.

9. A digital panel meter as set forth in claim 8 wherein said front and rear circuit boards are supported from the base circuit board by circuit contact means.

10. A digital panel meter as set forth in claim 1 wherein said means for securing the housing to the panel comprises at least one locking tab on either side of the housing and disposed adjacent to the open front of the housing.

11. A digital panel meter as set forth in claim 10 including a pair of locking tabs on each sidewall of the housing.

12. A digital panel meter as set forth in claim 10 wherein the locking tab is directed slightly outward of the housing sidewall so as to be deflected by the panel when the housing is inserted in a panel opening.

13. A digital panel meter as set forth in claim 12 wherein the locking tab has a stepped end so as to accommodate panels of varying thickness.

14. A digital panel meter as set forth in claim 13 wherein said panel has a face and including a gasket between the housing and panel face.

15. A digital panel meter adapted to be mounted in a panel and comprising;
a housing having an open front, side walls and means for securing the housing to said panel,
a circuit assembly adapted to be disposed inside the housing and including at least one circuit board, terminal means at the rear of the circuit assembly and a digital display at the front of the circuit assembly and at the open front of the housing,
a bezel adapted to cover the open front of the housing and including a cover means having means defining a transparent window for viewing of said digital display and a pair of elongated bezel locking arms spacedly disposed in parallel and extending from said cover means toward the rear of the housing,
said housing having means defining spacedly disposed locking recesses,
said locking recesses being spaced relative to each other by a distance about the same as the distance between the locking arms,
said locking arms each having an end locking member adapted to interlock with the respective locking recess in the housing to secure the bezel cover means against the housing at the open front thereof,
said locking member at the end of each locking arm including a hood with each of the hooks being in spacing relationship,
said locking recesses being at the rear of the housing, one on either side of the terminal means, said housing including sidewalls each having longitudinally extending guide channels for each locking arm, at least one of said locking arm and guide channel having ramp means for maintaining an interlock between said locking arm and locking recess.

16. A digital panel meter as set forth in claim 15 wherein said locking arm has an arm ramp that complementarily engages with a recess ramp to force the hook end of the locking arm into positive engagement with the housing locking recess.

17. A digital panel meter as set forth in claim 16 wherein said locking arm has a U-channel cross-section with the arm ramp disposed in the U-channel spaced forwardly of the hook end of the locking arm.

18. A digital panel meter as set forth in claim 17 wherein the locking arm U-channels are disposed in outwardly facing relationship.

* * * * *